United States Patent
Kawasaki

(10) Patent No.: US 10,516,278 B2
(45) Date of Patent: Dec. 24, 2019

(54) INTEGRATED-CURRENT-AMOUNT MEASUREMENT APPARATUS, BATTERY-REMAINING-AMOUNT MEASUREMENT APPARATUS, AND ELECTRONIC DEVICE CONTROL SYSTEM

(71) Applicant: FUJITSU LIMITED, Kawasaki-shi, Kanagawa (JP)

(72) Inventor: Kenichi Kawasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 159 days.

(21) Appl. No.: 15/818,135

(22) Filed: Nov. 20, 2017

(65) Prior Publication Data

US 2018/0183251 A1   Jun. 28, 2018

(30) Foreign Application Priority Data

Dec. 28, 2016  (JP) .................................. 2016-256494

(51) Int. Cl.
  *H02J 7/00*   (2006.01)
  *G01R 31/36*  (2019.01)
  *G01R 31/3828* (2019.01)

(52) U.S. Cl.
  CPC ........ *H02J 7/0047* (2013.01); *G01R 31/3648* (2013.01); *G01R 31/3828* (2019.01); *H02J 7/0063* (2013.01); *H02J 2007/005* (2013.01); *H02J 2007/0067* (2013.01)

(58) Field of Classification Search
  CPC . G01R 31/3828; G01R 31/364; H02J 7/0047; H02J 2007/005; H02J 2007/0067; H02J 7/0063
  See application file for complete search history.

(56) References Cited

U.S. PATENT DOCUMENTS

| 6,091,246 A * | 7/2000 | Saigo ................. G01R 31/3648 324/434 |
| 2006/0202857 A1* | 9/2006 | Kawahara .......... G01R 31/3648 340/870.02 |
| 2019/0097834 A1* | 3/2019 | Dempsey ............. G01D 11/245 |

FOREIGN PATENT DOCUMENTS

| JP | 2001-118607 A | 4/2001 |
| JP | 2007-078443 A | 3/2007 |

\* cited by examiner

*Primary Examiner* — Jared Fureman
*Assistant Examiner* — Duc M Pham
(74) *Attorney, Agent, or Firm* — Arent Fox LLP

(57) ABSTRACT

A measurement circuit measures a first integrated amount (integrated current amount) of a current which flows from a battery to a load. The first integrated amount is an amount in a first time period in which the measurement circuit operates. A detection circuit detects the number of operations of the load. A calculation circuit calculates a second integrated amount (total integrated-current amount) of the current on the basis of the number of operations and the first integrated amount. The second integrated amount is an amount in a third time period including a second time period in which the measurement circuit stops.

6 Claims, 18 Drawing Sheets

FIG. 16

| SENSOR NODE | BATTERY-REMAINING-AMOUNT RATIO Rr [%] |
|---|---|
| N1 | 72 |
| N2 | 48 |
| N3 | 65 |
| N4 | 68 |
| N5 | 68 |
| N6 | 57 |
| N7 | 55 |
| N8 | 50 |

| ORDER ON REMAINING AMOUNT | SENSOR NODE | BATTERY-REMAINING-AMOUNT RATIO Rr [%] |
|---|---|---|
| 8 | N2 | 48 |
| 7 | N8 | 50 |
| 6 | N7 | 55 |
| 5 | N6 | 57 |
| 4 | N3 | 65 |
| 3 | N4 | 68 |
| 2 | N5 | 68 |
| 1 | N1 | 72 |

INTEGRATED-CURRENT-AMOUNT MEASUREMENT APPARATUS, BATTERY-REMAINING-AMOUNT MEASUREMENT APPARATUS, AND ELECTRONIC DEVICE CONTROL SYSTEM

CROSS-REFERENCE TO RELATED APPLICATION

This application is based upon and claims the benefit of priority of the prior Japanese Patent Application No. 2016-256494, filed on Dec. 28, 2016, the entire contents of which are incorporated herein by reference.

FIELD

The embodiments discussed herein are related to an integrated-current-amount measurement apparatus, a battery-remaining-amount measurement apparatus, and an electronic device control system.

BACKGROUND

In some battery-driven devices, an integrated current amount is measured to estimate a remaining amount and a replacement timing of a battery. The integrated current amount indicates how much the battery has consumed current since replaced (or fully charged). The integrated current amount is measured by using a measurement circuit such as a coulomb counter.

To reduce consumption current of the measurement, there is proposed a technique which detects time periods in which a current from a battery to a load has a value greater than a predetermined value, measures an integrated current amount and an internal state of the battery only in the time periods, and stops the measurement in the other time periods.

See, for example, Japanese Laid-open Patent Publication Nos. 2001-118607 and 2007-078443.

By the way, some battery-driven loads have a relatively longer standby time. For example, some sensor devices intermittently operate to save remaining amount of a battery, for acquiring environmental data. In the case where such a load is used, because the integrated current amount in the standby time becomes relatively larger, the above method of measuring the integrated current amount only in the time periods, in which the current from the battery to the load has a greater value, is not able to accurately measure a total integrated-current amount. As countermeasures to this problem, there is conceived another technique in which the measurement circuit is periodically turned on and off; an average current is calculated by using time periods in which the measurement circuit is turned on and an integrated current amount obtained in the time periods; and a total integrated-current amount is calculated, based on an assumption that the average current flows also in time periods in which the measurement circuit is turned off.

However, in a case where operation intervals of a load change while the measurement circuit is turned off (for example, in a case where data-acquisition intervals of a sensor device change in accordance with environmental conditions), a calculated average current becomes different from an actual average current. This causes deterioration of calculation accuracy of the total integrated-current amount.

SUMMARY

In one aspect of the embodiments, there is provided an integrated-current-amount measurement apparatus. The integrated-current-amount measurement apparatus includes: a measurement circuit configured to measure a first integrated amount of a current which flows from a battery to a load, the first integrated amount being an amount in a first time period in which the measurement circuit operates; a detection circuit configured to detect a number of operations of the load; and a calculation circuit configured to calculate a second integrated amount of the current on a basis of the number of operations and the first integrated amount, the second integrated amount being an amount in a third time period including a second time period in which the measurement circuit stops.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 16 illustrates one example of a sort;

DESCRIPTION OF EMBODIMENTS

Hereinafter, some embodiments will be described with reference to the accompanying drawings.

First Embodiment

Figure 1:
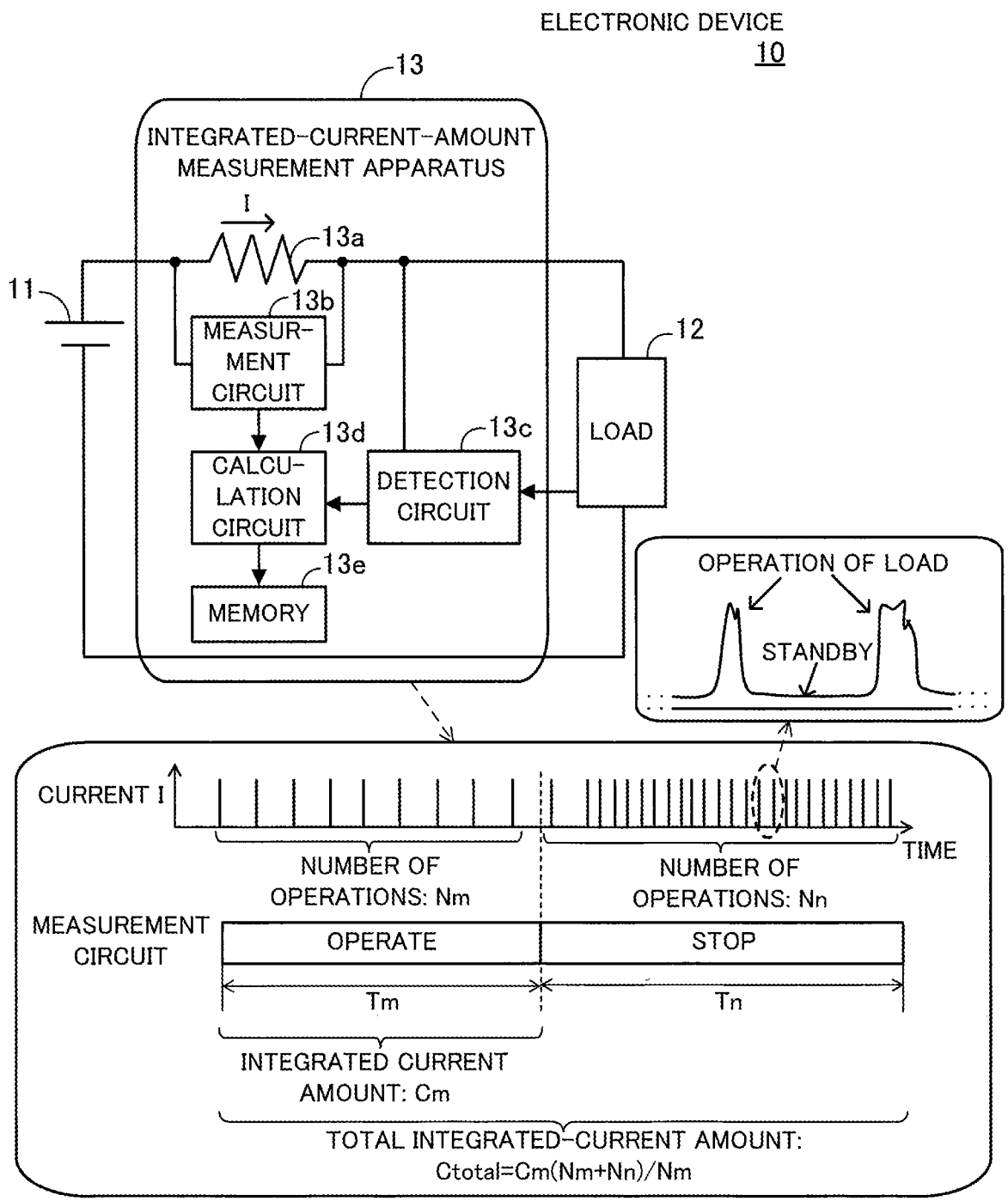
FIG. 1 illustrates one example of an electronic device and an integrated-current-amount measurement apparatus of a first embodiment.

FIG. 1 illustrates one example of an electronic device and an integrated-current-amount measurement apparatus of a first embodiment.

An electronic device 10 is, for example, a smartphone, a tablet terminal, or an IoT (Internet of Things) device which operates with a primary battery (disposable battery such as a dry battery or a button battery) or a secondary battery (rechargeable battery).

The electronic device 10 includes a battery 11, a load 12, and an integrated-current-amount measurement apparatus 13.

The battery 11 is a primary or secondary battery.

The load 12 operates using a voltage supplied by the battery 11. The load 12 intermittently operates, and the operation interval is able to be changed. One example of the load 12 is a sensor device. For example, the sensor device may be installed on a manhole in a sewage-overflow detection system to detect a water level, and may have its operation interval shorter in rainy weather than in clear weather.

The integrated-current-amount measurement apparatus 13 includes a resistor 13a, a measurement circuit 13b, a detection circuit 13c, a calculation circuit 13d, and a memory 13e.

The resistor 13a is connected between the battery 11 and the load 12.

The measurement circuit 13b measures an integrated amount of a current which flows from the battery 11 to the load 12. The measurement circuit 13b is connected between both ends of the resistor 13a. The measurement circuit 13b determines a current I from a voltage drop across the resistor 13a; calculates an integrated amount of the current I by integrating the current I with respect to time; and outputs the integrated amount of the current I. The measurement circuit 13b operates not continuously but intermittently to reduce power consumption. For example, the measurement circuit 13b operates for one hour per day, and does not operate for the other 23 hours. The measurement circuit 13b uses, for example, a coulomb counter.

The detection circuit 13c detects the number of operations of the load 12. For example, the detection circuit 13c detects an increase of the current I and increments a count value on the number of operations of the load 12, determining that the load 12 has operated when the current I increases. In a case where the load 12 itself outputs a signal which indicates an operation of the load 12, the detection circuit 13c increments the count value on the number of operations, when receiving the signal.

The calculation circuit 13d calculates an integrated current amount (total integrated-current amount) in a certain time period including a time period in which the measurement circuit 13b stops, on the basis of the number of operations of the load 12, and the integrated amount (integrated current amount) of the current I obtained in a time period in which the measurement circuit 13b operates.

The memory 13e stores the integrated current amount calculated by the calculation circuit 13d.

In FIG. 1, an example of calculating the integrated current amount is illustrated.

When the load 12 operates, the current I increases. In the case where the load 12 intermittently operates, the current I changes as illustrated in FIG. 1. Here, it is noted that even when the load 12 is not operated (when the load 12 is in a standby time), a standby current flows.

As illustrated in FIG. 1, the measurement circuit 13b operates, for example, in a time period Tm, and outputs an integrated current amount Cm obtained in the time period Tm. After operating in the time period Tm, the measurement circuit 13b stops, for example, in a time period Tn, and operates again in the following time period Tm. Thus, the measurement circuit 13b performs an intermittent operation in which the operation in the time period Tm and the non-operation in the time period Tn are repeated.

The calculation circuit 13d calculates the total integrated-current amount, for example, at a timing at which the time period Tn elapses. The total integrated-current amount is expressed by the following equation (1):

$$Ctotal = Cm(Nm+Nn)/Nm \qquad (1)$$

In the equation (1), Ctotal is the total integrated-current amount, Nm is the number of operations of the load 12 in the time period Tm, and Nn is the number of operations of the load 12 in the time period Tn.

The calculation circuit 13d receives the integrated current amount Cm from the measurement circuit 13b; receives the number of operations Nm and Nn from the detection circuit 13c; calculates the total integrated-current amount Ctotal by using the equation (1); and outputs the total integrated-current amount Ctotal. The total integrated-current amount Ctotal is stored in the memory 13e.

Figure 2:
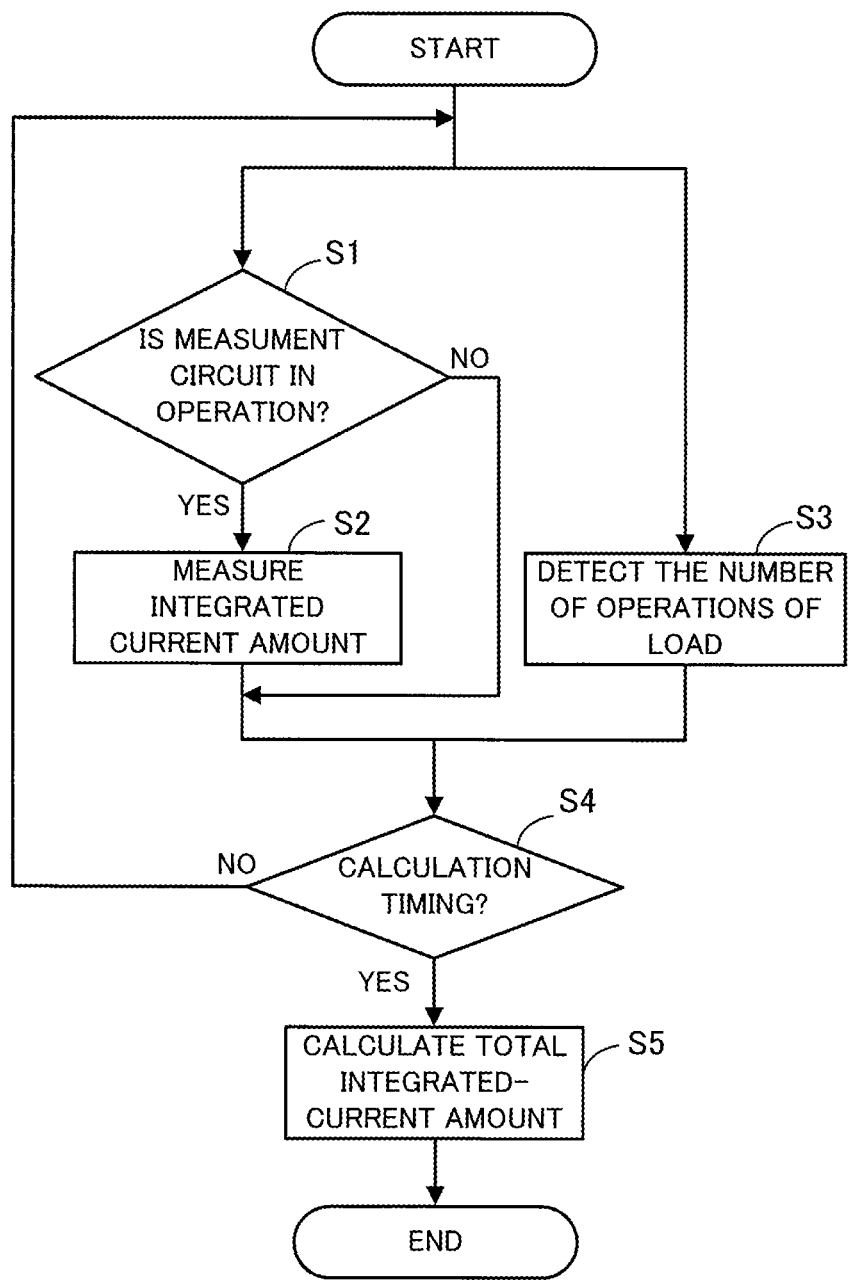
FIG. 2 is a flowchart illustrating one example of an operation of the integrated-current-amount measurement apparatus.

FIG. 2 is a flowchart illustrating one example of an operation of the integrated-current-amount measurement apparatus 13.

If the measurement circuit 13b is in operation (Step S1: YES), then the measurement circuit 13b measures the integrated current amount (Step S2). The detection circuit 13c detects the number of operations of the load 12, regardless of whether the measurement circuit 13b is in operation (Step S3). If the measurement circuit 13b is not in operation (Step S1: NO), or if Steps S2 and S3 are completed, then the process proceeds to Step S4. If a calculation timing of the total integrated-current amount Ctotal is satisfied (Step S4: YES), the calculation circuit 13d calculates the total integrated-current amount Ctotal (Step S5). For example, the calculation circuit 13d calculates the total integrated-current amount Ctotal, every time a total time period of Tm and Tn elapses. If the calculation timing of the total integrated-current amount Ctotal is not satisfied (Step S4: NO), the processes performed from Steps S1 and S3 are repeated.

The calculation circuit 13d may read a total integrated-current amount Ctotal calculated last time from the memory 13e; and add the total integrated-current amount Ctotal calculated last time to a total integrated-current amount Ctotal calculated this time to update the total integrated-current amount Ctotal calculated last time.

The calculation circuit 13d may calculate an integrated current amount C1 obtained in a single operation of the load 12; and calculate the product of the integrated current amount C1 and the number of operations of the load 12 obtained at a calculation timing indicated by a server (not illustrated), as a total integrated-current amount Ctotal obtained at the calculation timing. The integrated current amount C1 obtained in the single operation of the load 12 is expressed as $C1=Cm/Nm$.

The calculation circuit 13d may calculate an average current Iav in the total time period of Tm and Tn; and output the average current Iav. The memory 13e may store the average current Iav. The average current Iav is expressed as Iav=Ctotal/(Tm+Tn).

In the integrated-current-amount measurement apparatus 13 of the first embodiment as described above, the total integrated-current amount Ctotal in the total time period, including the time period Tn in which the measurement circuit 13b stops, is calculated by using the integrated current amount Cm, which is measured by the intermittently-operated measurement circuit 13b, and the number of operations of the load 12. With this operation, even when the operation interval of the load 12 changes while the measurement circuit 13b stops, the change in the operation interval affects the calculation result of the total integrated-current amount Ctotal. As a result, even when the measurement circuit 13b operates intermittently to reduce consumption current, the deterioration of calculation accuracy of the total integrated-current amount Ctotal is prevented.

In addition, because the total integrated-current amount Ctotal, calculated in such a manner, includes currents which flow in standby times of the load 12, the deterioration of calculation accuracy is prevented even when a sensor device having longer standby times is used as the load 12.

Second Embodiment

Figure 3:
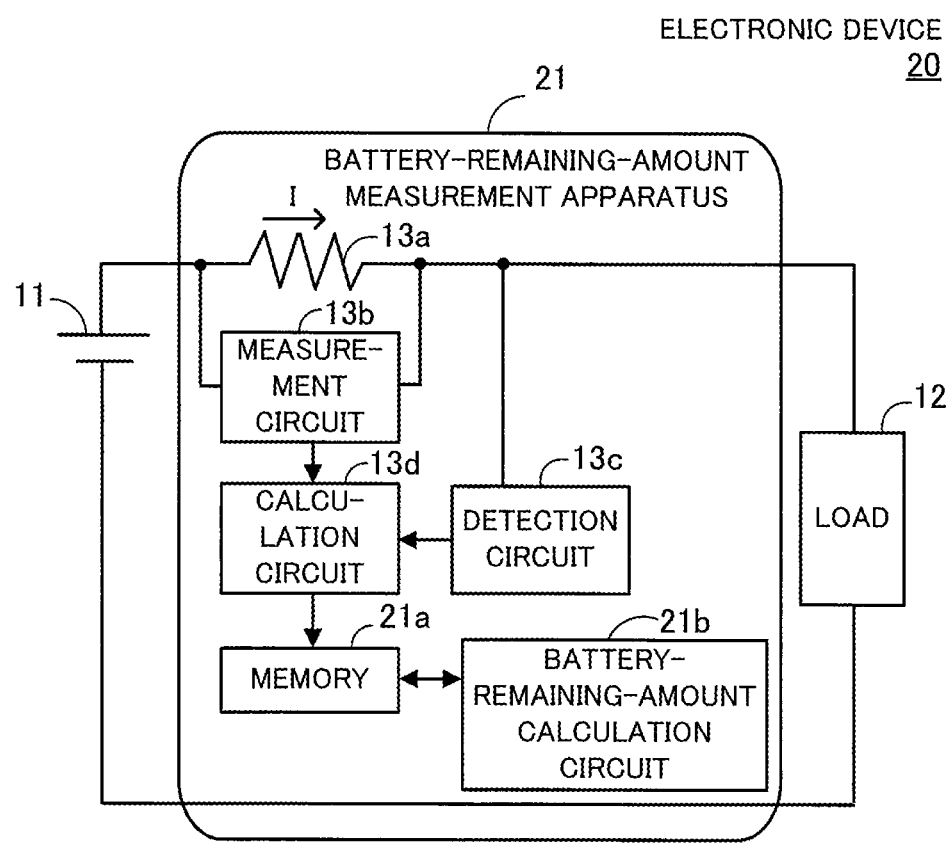
FIG. 3 illustrates one example of an electronic device and a battery-remaining-amount measurement apparatus of a second embodiment.

FIG. 3 illustrates one example of an electronic device and a battery-remaining-amount measurement apparatus of a second embodiment. In FIG. 3, identical components with those of the electronic device of the first embodiment illustrated in FIG. 1 are designated with identical symbols.

An electronic device 20 of the second embodiment includes a battery-remaining-amount measurement apparatus 21. The battery-remaining-amount measurement apparatus 21 includes the resistor 13a, the measurement circuit 13b, the detection circuit 13c, the calculation circuit 13d, a memory 21a, and a battery-remaining-amount calculation circuit 21b.

The memory 21a stores a battery capacity of the battery 11 in addition to the total integrated-current amount Ctotal calculated by the calculation circuit 13d. The memory 21a also stores a battery remaining amount calculated by the battery-remaining-amount calculation circuit 21b.

The battery-remaining-amount calculation circuit 21b calculates the battery remaining amount by using the battery capacity of the battery 11 and the total integrated-current amount Ctotal. The battery remaining amount is expressed as Cr=Cbat−Ctotal, where Cr is the battery remaining amount, and Cbat is the battery capacity. The total integrated-current amount Ctotal is updated by adding the total integrated-current amount Ctotal calculated this time to a total integrated-current amount Ctotal calculated last time.

The battery-remaining-amount calculation circuit 21b may update the battery remaining amount Cr by reading the battery remaining amount Cr calculated last time from the memory 21a, and by subtracting the total integrated-current amount Ctotal calculated this time from the battery remaining amount Cr.

The operation of the battery-remaining-amount measurement apparatus 21 of the second embodiment is the same as that of the integrated-current-amount measurement apparatus 13 of the first embodiment, except that the battery-remaining-amount calculation circuit 21b calculates the battery remaining amount Cr after Step S5 of the flowchart of FIG. 2, by using the above-described equation.

The battery-remaining-amount calculation circuit 21b may calculate a battery-remaining-amount ratio Rr and a battery exhaustion time Te, as follows.

$$Rr=Cr/Cbat$$

$$Te=Cr/Iav$$

The battery-remaining-amount measurement apparatus 21 of the second embodiment, configured in such a manner, produces effects similar to those of the integrated-current-amount measurement apparatus 13 of the first embodiment, and accurately determines the battery remaining amount as a result of calculating the battery remaining amount by using the total integrated-current amount calculated in the above-described manner.

Third Embodiment

Figure 4:
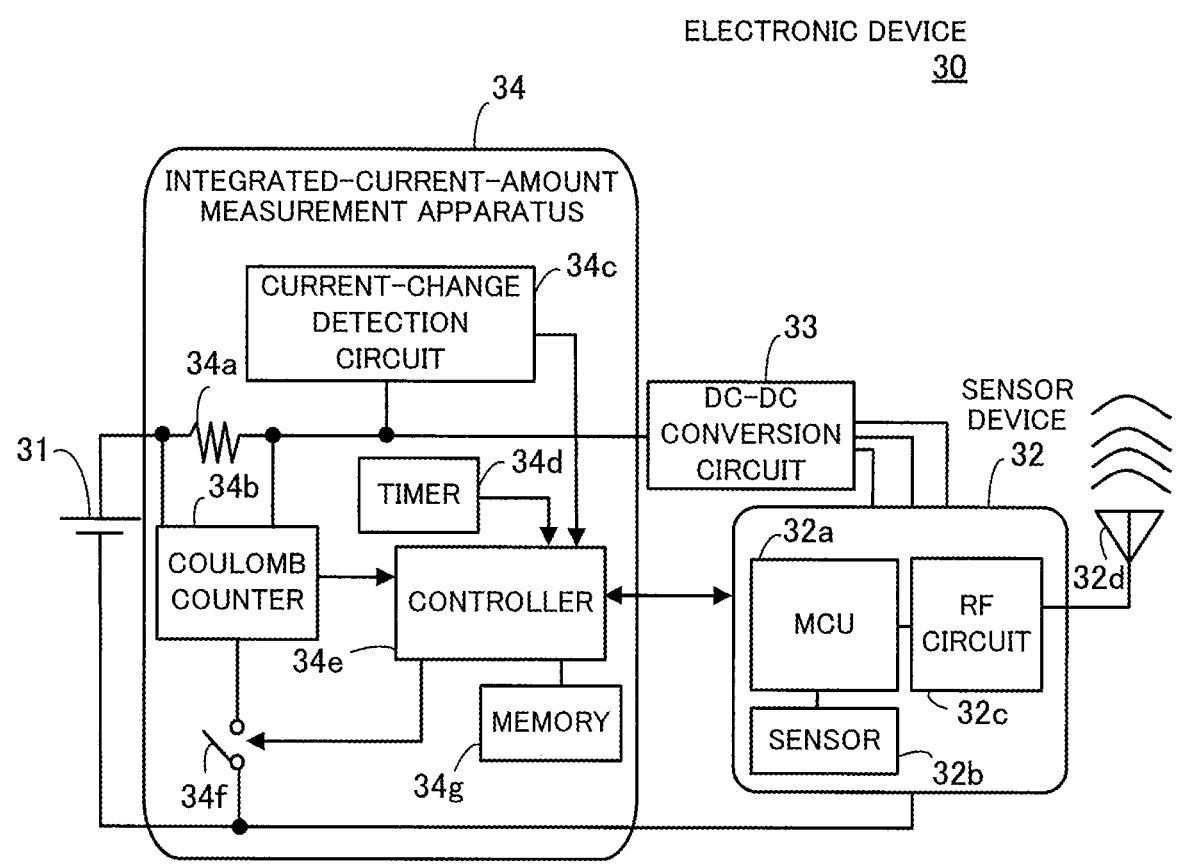
FIG. 4 illustrates one example of an electronic device and an integrated-current-amount measurement apparatus of a third embodiment.

FIG. 4 illustrates one example of an electronic device and an integrated-current-amount measurement apparatus of a third embodiment.

An electronic device 30 is, for example, a smartphone, a tablet terminal, or an IoT device which operates with a primary or secondary battery. The electronic device 30 includes a battery 31, a sensor device 32, a DC-DC conversion circuit 33 (DC stands for direct current), and an integrated-current-amount measurement apparatus 34.

The battery 31 is a primary or secondary battery.

The sensor device 32 is an example of the load 12 illustrated in FIG. 1. The sensor device 32 includes a micro control unit (MCU) 32a, a sensor 32b, and a radio frequency (RE) circuit 32c.

The MCU 32a controls the sensor 32b and the RF circuit 32c. For example, the MCU 32a changes the operation interval (operation period) of the sensor 32b in accordance with a signal which the RE circuit 32c has received via an antenna 32d. For example, in a case where the sensor device 32 is installed on a manhole in a sewage-overflow detection system to detect a water level, the MCU 32a may change the operation interval in accordance with weather information which the RF circuit 32c has received from a server (not illustrated). For example, the MCU 32a causes the operation interval of the sensor 32b to be shorter in rainy weather than in clear weather.

In addition, the MCU 32a causes the RE circuit 32c to send data measured by the sensor 32b and the integrated current amount measured by the integrated-current-amount measurement apparatus 34 to the server via the antenna 32d.

The sensor 32b acquires environmental data, such as temperature, humidity, or water level in the case of the above-described sewage-overflow detection system; and converts the environmental data to an electrical signal.

The RF circuit 32c wirelessly communicates with an external apparatus via the antenna 32d.

The DC-DC conversion circuit 33 converts a voltage supplied from the battery 31 into voltages suitable to the MCU 32a, the sensor 32b, and the RF circuit 32c.

The integrated-current-amount measurement apparatus 34 includes a resistor 34a, a coulomb counter 34b, a current-change detection circuit 34c, a timer 34d, a controller 34e, a switch 34f, and a memory 34g.

The resistor 34a is connected between the battery 31 and the DC-DC conversion circuit 33.

The coulomb counter 34b outputs a value proportional to an integrated amount (integrated current amount) of a current which flows from the battery 31. The coulomb counter 34b is connected between both ends of the resistor 34a. The coulomb counter 34b does not operate all the time. To reduce power consumption, the coulomb counter 34b has time periods in which the coulomb counter 34b operates, and time periods in which the coulomb counter 34b does not operate. For example, the coulomb counter 34b operates for one hour per day, and does not operate for the other 23 hours.

The current-change detection circuit 34c detects an increase of a current (load current) which flows in the sensor device 32. For example, the current-change detection circuit 34c outputs a pulse signal when the load current increases.

The timer 34d outputs a timer value which indicates time.

The controller 34e controls the switch 34f, based on the timer value, a value of the time periods in which the coulomb counter 34b operates, and a value of the time periods in which the coulomb counter 34b stops. Both the values are stored in the memory 34g.

In addition, the controller 34e increments a count value on the number of operations of the sensor device 32, every time the controller 34e receives the pulse signal outputted by the current-change detection circuit 34c. The integrated-current-amount measurement apparatus 34 of the third embodiment causes the controller 34e and the current-change detection circuit 34c to achieve the function of the detection circuit 13c of FIG. 1. The controller 34e calculates the integrated current amount by using the value which is proportional to the integrated current amount and outputted by the coulomb counter 34b, and a resistance value of the resistor 34a. The integrated-current-amount measurement apparatus 34 of the third embodiment causes the controller 34e and the coulomb counter 34b to achieve the function of the measurement circuit 13b of FIG. 1.

The controller 34e also has the function of the calculation circuit 13d of FIG. 1. That is, the controller 34e calculates the total integrated-current amount by using the number of operations of the sensor device 32 and the integrated current amount obtained in the time period in which the coulomb counter 34b operates. The controller 34e also has a function to send/receive information data to/from the sensor device 32.

The memory 34g stores, for example, the value of the time periods in which the coulomb counter 34b operates, the value of the time periods in which the coulomb counter 34b stops, the number of operations of the sensor device 32, the integrated current amount outputted by the coulomb counter 34b, and the total integrated-current amount calculated by the controller 34e. The memory 34g may be a plurality of registers, or may be a random access memory (RAM) or a flash memory.

The switch 34f is connected between the coulomb counter 34b and the negative terminal of the battery 31, and is controlled by the controller 34e.

Hereinafter, one example of the coulomb counter 34b, the current-change detection circuit 34c, and the controller 34e of the integrated-current-amount measurement apparatus 34 will be described.

One Example of Coulomb Counter 34b

Figure 5:
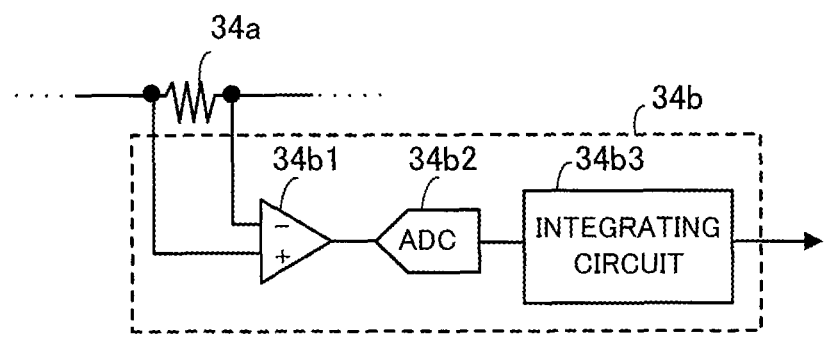
FIG. 5 illustrates one example of a coulomb counter.

FIG. 5 illustrates one example of the coulomb counter 34b.

The coulomb counter 34b includes an amplifier 34b1, an analog-to-digital converter (ADC) 34b2, and an integrating circuit 34b3.

The amplifier 34b1 amplifies a potential difference across the resistor 34a.

The ADC 34b2 converts the output from the amplifier 34b1 into a digital value.

The integrating circuit 34b3 integrates the digital value with respect to time, and outputs an integrated value.

A current (load current) I which flows in the resistor 34a is expressed as $I=\Delta V/R$, where R is a resistance value of the resistor 34a, and $\Delta V$ is a potential difference across the resistor 34a. Thus, the value obtained by integrating a digital value, which corresponds to $\Delta V$, with respect to time is proportional to the integrated current amount of the load current I. The controller 34e calculates the integrated current amount by dividing the value outputted by the integrating circuit 34b3 by a gain of the amplifier 34b1 and the resistance value R.

Figure 6:
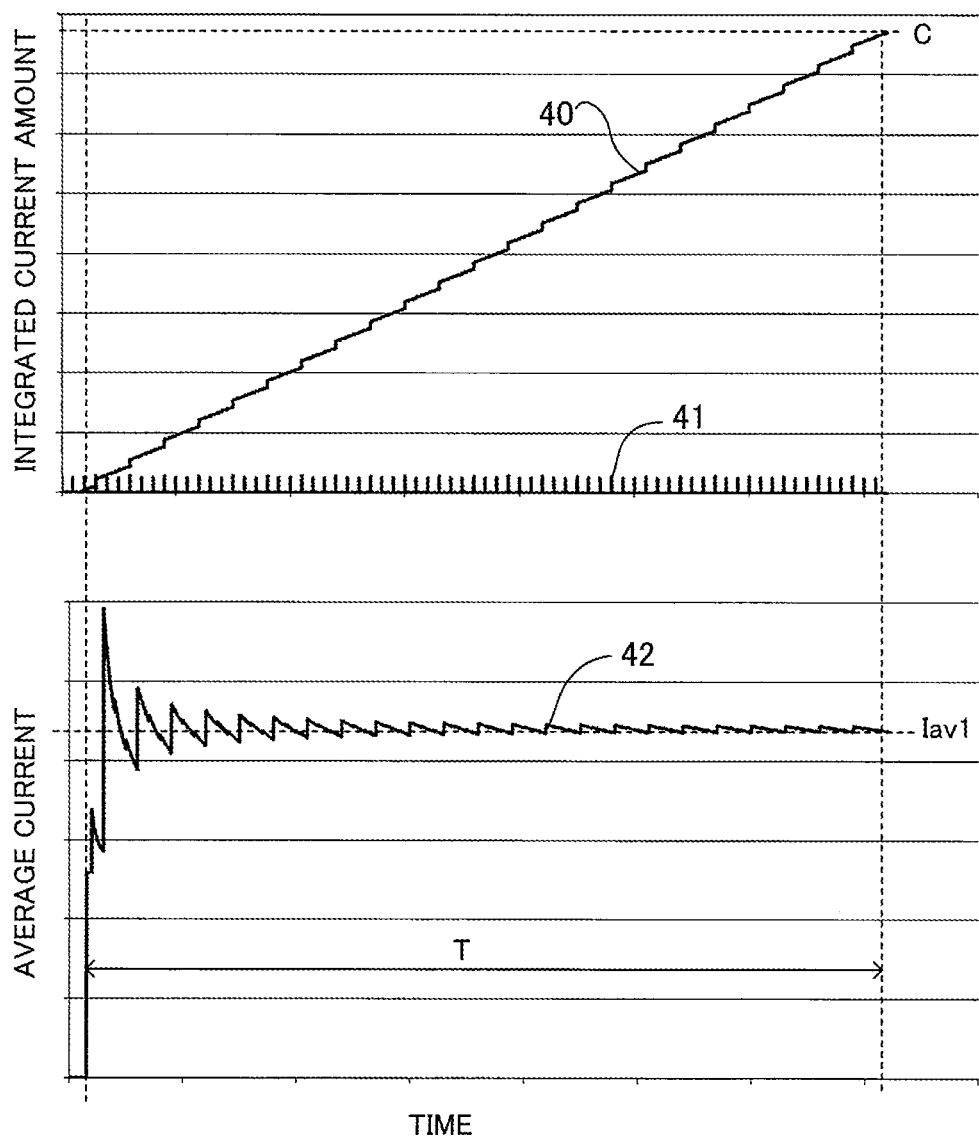
FIG. 6 illustrates one example of an integrated current amount and an average current.

FIG. 6 illustrates one example of an integrated current amount and an average current. The vertical axes represent the integrated current amount and the average current, and the horizontal axes represent time.

A waveform 40 indicates the integrated current amount which changes with time. A waveform 41 indicates the load current which changes with time. A waveform 42 indicates the average current which changes with time.

As indicated by the waveform 40, every time the sensor device 32 operates and the load current increases, the integrated current amount increases. As indicated by the waveform 42, when the sensor device 32 operates with a constant operation interval, the average current converges to a certain value. For example, an average current value Iav1 of the coulomb counter 34b in an operation time T is expressed as $Iav1=C/T$, where C is an integrated current amount in the operation time T.

One Example of Current-change Detection Circuit 34c

Figure 7:
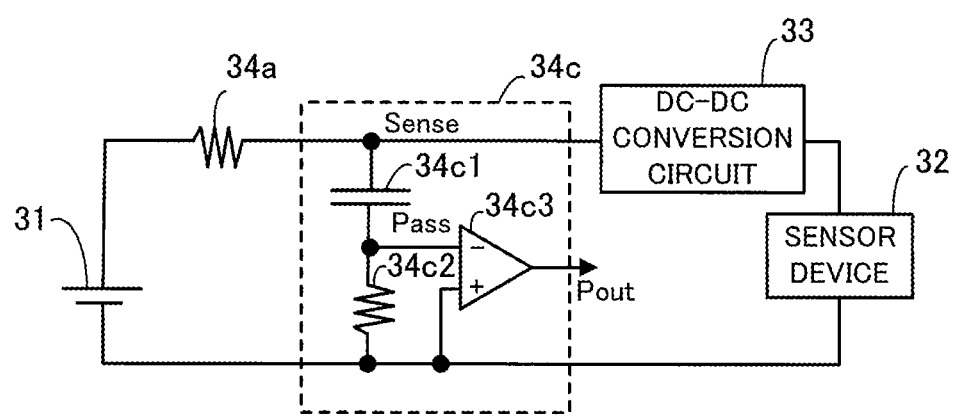
FIG. 7 illustrates one example of a current-change detection circuit.

FIG. 7 illustrates one example of the current-change detection circuit 34c. In FIG. 7, the coulomb counter 34b, the timer 34d, the controller 34e, the switch 34f, and the memory 34g of FIG. 4 are omitted.

The current-change detection circuit 34c includes a capacitor 34c1, a resistor 34c2, and a comparator 34c3.

One end of the capacitor 34c1 is connected to one end of the resistor 34a and the DC-DC conversion circuit 33. The other end of the capacitor 34c1 is connected to one end of the resistor 34c2 and the inverting input terminal of the comparator 34c3. The other end of the resistor 34c2 and the non-inverting input terminal of the comparator 34c3 are connected to the negative terminal of the battery 31. The output terminal of the comparator 34c3 is connected to the controller 34e illustrated in FIG. 4.

Figure 8:
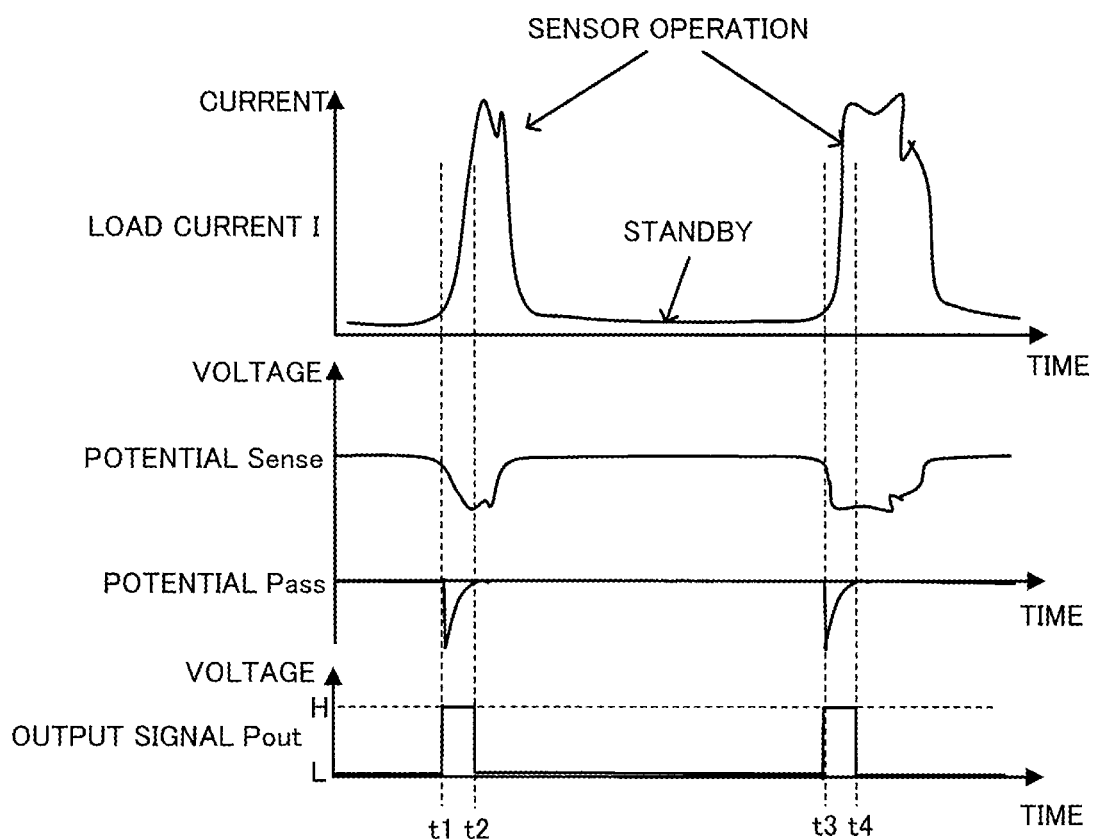
FIG. 8 illustrates one example of an operation of the current-change detection circuit.

FIG. 8 illustrates one example of an operation of the current-change detection circuit. In FIG. 8, the load current I; an electric potential Sense at one end of the capacitor 34c1; an electric potential Pass at the inverting input terminal of the comparator 34c3; and an output signal Pout from the comparator 34c3 are illustrated as one example. The vertical axes represent current or voltage, and the horizontal axes represent time.

The series circuit of the capacitor 34c1 and the resistor 34c2 functions as a high-pass filter. When the sensor device 32 starts to operate, the load current I increases, and the electric potential Sense drops rapidly. Then, the electric potential Pass at the inverting input terminal of the comparator 34c3 also drops (timing t1). At this time, the voltage of the output signal Pout from the comparator 34c3 has a high (H) level. After that, when the electric potential Sense changes gently and the electric potential Pass rises (timing t2), the voltage of the output signal Pout has a low (L) level.

Then, the sensor device 32 enters a standby mode. After that, when the sensor device 32 starts to operate again, the load current I increases, and the voltage of the output signal Pout has the H level again in a time period between a timing t3 and a timing t4.

As described above, the current-change detection circuit 34c outputs a pulse signal, as the output signal Pout, when detecting an operation of the sensor device 32.

One Example of Controller 34e

Figure 9:
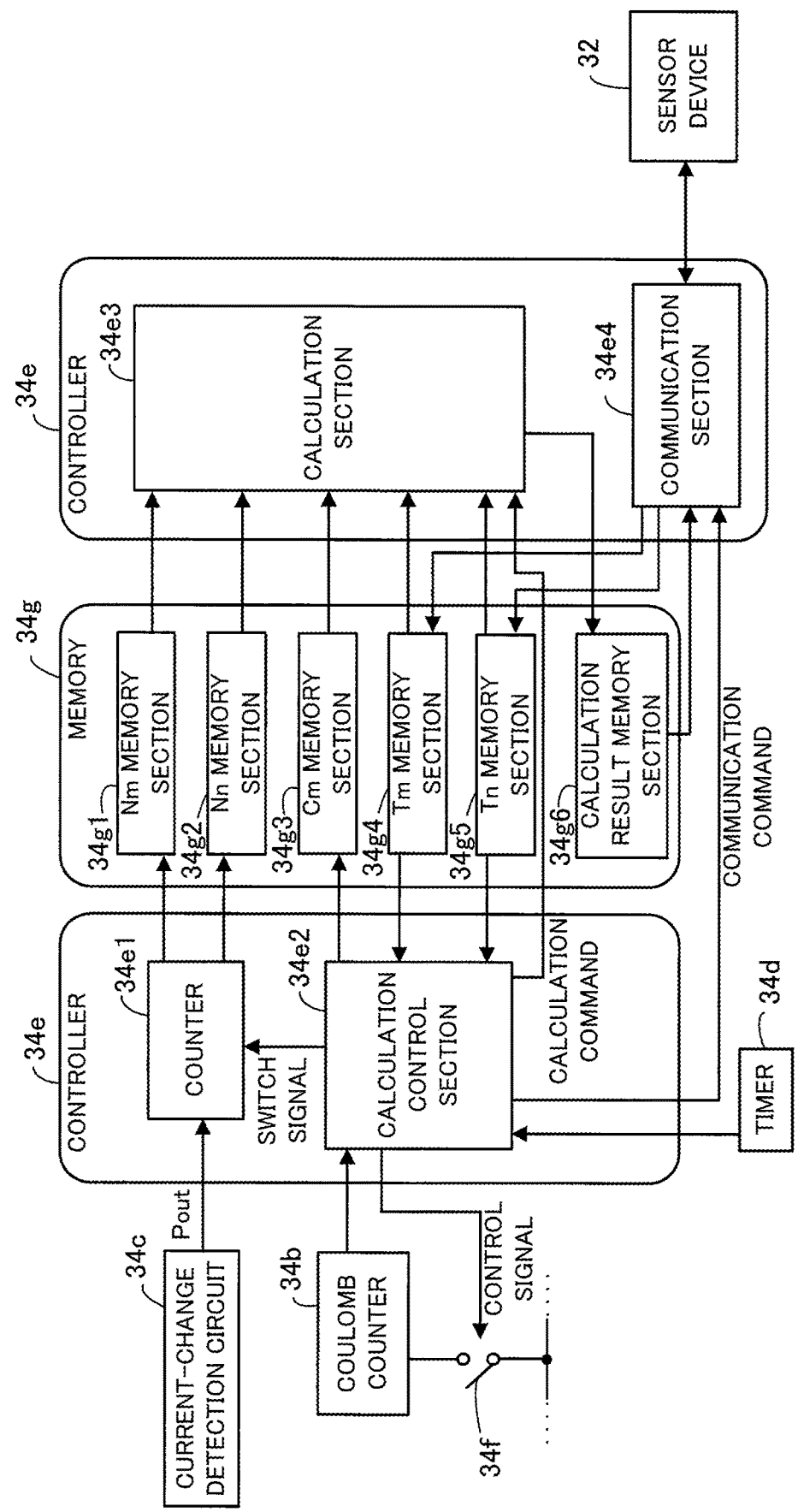
FIG. 9 illustrates one example of a controller.

FIG. 9 illustrates one example of the controller 34e.

The controller 34e includes a counter 34e1, a calculation control section 34e2, a calculation section 34e3, and a communication section 34e4. In FIG. 9, one example of the memory 34g is also illustrated. The memory 34g includes an Nm memory section 34g1, an Nn memory section 34g2, a Cm memory section 34g3, a Tm memory section 34g4, a Tn memory section 34g5, and a calculation result memory section 34g6.

The counter 34e1 counts the number of pulses of the output signal Pout from the current-change detection circuit 34c. The counter 34e1 outputs the count value as the number of operations Nm of the sensor device 32 in the time period Tm, or as the number of operations Nn of the sensor device 32 in the time period Tn, depending on a switch signal outputted by the calculation control section 34e2. The time period Tm is a time period in which the coulomb counter 34b operates, and the time period Tn is a time period in which the coulomb counter 34b stops.

When the switch signal instructs the counter 34e1 to count the number of operations Nm, the counter 34e1 counts the number of pulses of the output signal Pout as the number of operations Nm. On the other hand, when the switch signal instructs the counter 34e1 to count the number of operations Nn, the counter 34e1 counts the number of pulses of the output signal Pout as the number of operations Nn. The counter 34e1 outputs the count value as the number of operations Nm or Nn, every time the switch signal changes.

The number of operations Nm is stored in the Nm memory section 34g1, and the number of operations Nn is stored in the Nn memory section 34g2.

The calculation control section 34e2 outputs a control signal, depending on the timer value outputted by the timer 34d. The control signal turns on the switch 34f in the time period Tm, which is stored in the Tm memory section 34g4; and turns off the switch 34f in the time period Tn, which is stored in the Tn memory section 34g5. The calculation control section 34e2 outputs the switch signal, in the time period Tm, which instructs the counter 34e1 to count the number of operations Nm; and outputs the switch signal, in the time period Tn, which instructs the counter 34e1 to count the number of operations Nn.

In addition, the calculation control section 34e2 calculates the integrated current amount Cm by using the value which is proportional to the integrated current amount and outputted by the coulomb counter 34b, and a resistance value of the resistor 34a (see FIG. 4). The integrated current amount Cm is stored in the Cm memory section 34g3.

Furthermore, the calculation control section 34e2 sends a calculation command to the calculation section 34e3, and a communication command to the communication section 34e4 when the time period Tn elapses.

Upon receiving the calculation command, the calculation section 34e3 reads the number of operations Nm and Nn and the integrated current amount Cm from the memory 34g; calculates the total integrated-current amount Ctotal by using the above-described equation (1); and outputs the total integrated-current amount Ctotal. The calculation section 34e3 may also read the time periods Tm and Tn from the memory 34g; calculate the average current Iav expressed as Iav=Ctotal/(Tm+Tn); and output the average current Iav.

The total integrated-current amount Ctotal and the average current Iav, calculated in such a manner, are stored in the calculation result memory section 34g6.

The communication section 34e4 sends/receives information data to/from the sensor device 32. Upon receiving the communication command from the calculation control section 34e2, the communication section 34e4 reads the total integrated-current amount Ctotal and the average current Iav from the memory 34g, and sends them to the sensor device 32 as measurement results. The communication section 34e4 may send the measurement results currently stored to the sensor device 32 when receiving a data request (communication command) from the sensor device 32.

The communication section 34e4 may receive the time periods Tm and Tn from the sensor device 32; and store the time period Tm in the Tm memory section 34g4 and the time period Tn in the Tn memory section 34g5. For example, in a case where the environment around the sensor device 32 changes greatly (e.g. abrupt change in temperature), the time period Tm may be made longer, and the time period Tn may be made shorter. This update of the time periods Tm and Tn produces a more accurate total integrated-current amount. On the other hand, in a case where the environment around the sensor device 32 less changes, the time period Tm may be made shorter, and the time period Tn may be made longer. This update of the time periods Tm and Tn more effectively reduces power consumption.

The function of each section of the controller 34e is achieved with one or more processors (CPUs: central processing units) or digital signal processors (DSPs). The controller 34e may be achieved with an application specific electronic circuit, such as an application specific integrated circuit (ASIC) or a field programmable gate array (FPGA).

Example of Operation of Integrated-current-amount Measurement Apparatus 34 of Third Embodiment Next, with reference to a timing chart, an example of an operation of the integrated-current-amount measurement apparatus 34 of the third embodiment will be described.

Figure 10:
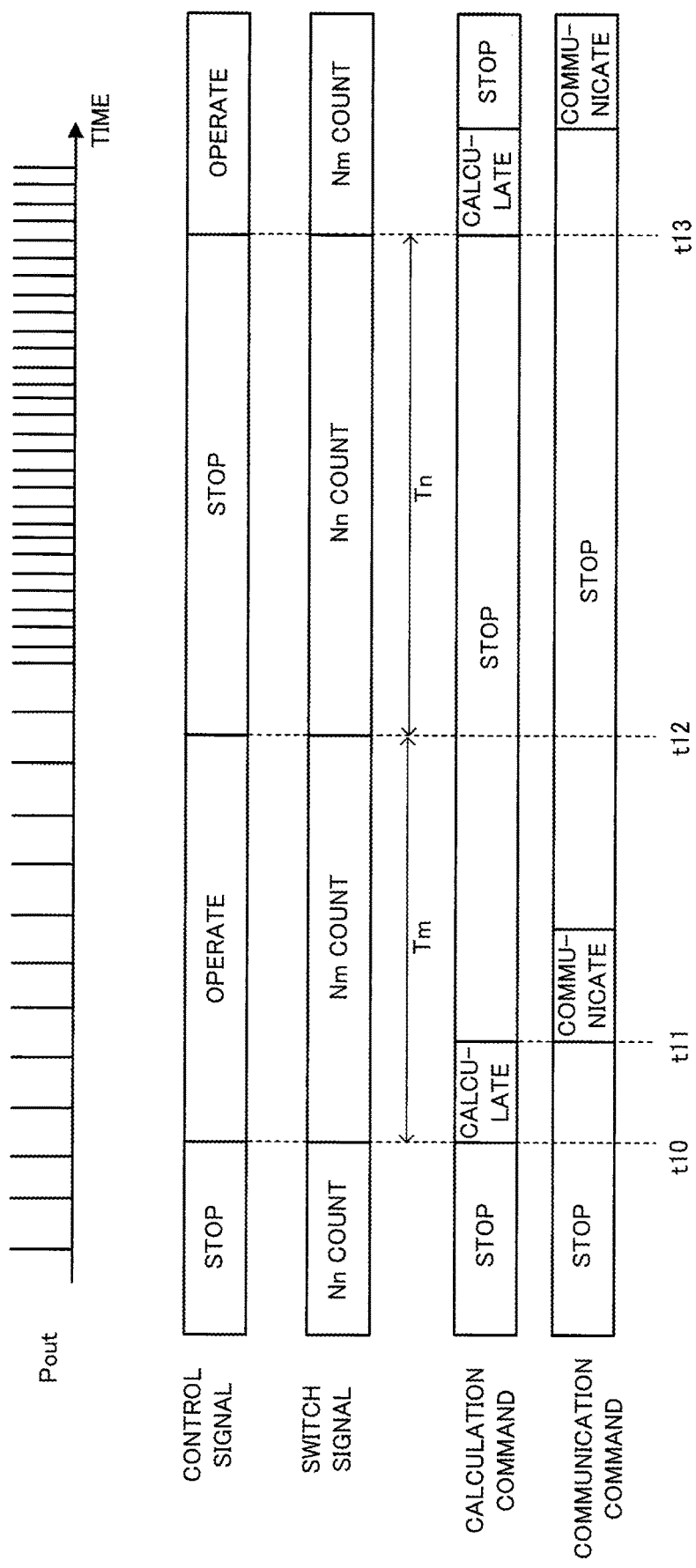
FIG. 10 is a timing chart illustrating one example of an operation of the integrated-current-amount measurement apparatus of the third embodiment.

FIG. 10 is a timing chart illustrating one example of an operation of the integrated-current-amount measurement apparatus 34 of the third embodiment.

In FIG. 10, the output signal Pout from the current-change detection circuit 34c, the control signal outputted (sent) by the calculation control section 34e2, the switch signal, the calculation command, and the communication command are illustrated as one example.

When the coulomb counter 34b is stopped by the control signal (when the switch 34f is turned off), the counter 34e1 counts the number of pulses of the output signal Pout as the number of operations Nn, depending on the switch signal which instructs the counter 34e1 to count the number of operations Nn. In this time, calculation of the calculation section 34e3 is stopped by the calculation command, and communication of the communication section 34e4 is also stopped by the communication command.

When the operation of the coulomb counter 34b is started by the control signal (timing t10), the calculation control section 34e2 outputs the switch signal which instructs the counter 34e1 to count the number of operations Nm. With this operation, a current counter value of the counter 34e1 is stored in the Nn memory section 34g2 to update the number of operations Nn, and the counter 34e1 starts counting for the number of operations Nm.

The calculation control section 34e2 sends to the calculation section 34e3 the calculation command which instructs the calculation section 34e3 to calculate. With this operation, the calculation section 34e3 calculates the total integrated-current amount Ctotal and the average current Iav. The total integrated-current amount Ctotal and the average current Iav stored in the memory 34g are then updated.

After that, the calculation control section 34e2 sends to the communication section 34e4 the communication command which instructs the communication section 34e4 to communicate (timing t11). With this operation, the communication section 34e4 reads the total integrated-current amount Ctotal and the average current Iav from the memory 34g, and sends them to the sensor device 32. The sensor device 32 receives the total integrated-current amount Ctotal and the average current Iav, and sends them to an external server, for example.

When the time period Tm elapses and the operation of the coulomb counter 34b is stopped by the control signal (timing t12), the calculation control section 34e2 outputs the switch signal which instructs the counter 34e1 to count the number of operations Nn. With this operation, a current counter value of the counter 34e1 is stored in the Nm memory section 34g1 to update the number of operations Nm, and the counter 34e1 starts counting for the number of operations Nn. At this time, the calculation control section 34e2 calculates the integrated current amount Cm by using the value which is proportional to the integrated current amount and outputted by the coulomb counter 34b, and a resistance value of the resistor 34a. With this operation, the integrated current amount Cm stored in the memory 34g is updated.

When the time period Tn elapses and the operation of the coulomb counter 34b is started by the control signal (timing t13), the same processes performed from timing t10 are performed.

The calculation section 34e3 may read a total integrated-current amount Ctotal calculated last time from the memory 34g; and add the total integrated-current amount Ctotal calculated last time to a total integrated-current amount Ctotal calculated this time to update the total integrated-current amount Ctotal calculated last time.

The calculation control section 34e2 may read an integrated current amount Cm which was stored in the memory 34g last time; and add the integrated current amount Cm stored last time to an integrated current amount Cm which is measured this time, to update the integrated current amount Cm stored last time. In this case, the number of operations Nm and the number of operations Nn to be stored in the memory 34g are also added to the previous values for update, every time the switch signal changes.

The communication section 34e4 may send the total integrated-current amount Ctotal stored in the memory 34g, to a server (not illustrated) via the sensor device 32, when receiving a request signal, which requests the total integrated-current amount Ctotal, from the server via the sensor device 32.

The calculation section 34e3 may calculate an integrated current amount C1 obtained in a single operation of the sensor device 32; and calculate the product of the integrated current amount C1 and the number of operations obtained at a calculation timing indicated by a server, as a total integrated-current amount Ctotal at the calculation timing. In this case, the number of operations Nm and the number of operations Nn, used to calculate the total integrated-current amount Ctotal, are added to the previous values for update, every time the switch signal changes.

The integrated-current-amount measurement apparatus 34 of the third embodiment produces the same effects as those of the integrated-current-amount measurement apparatus 13 of the first embodiment. In a case where the sensor device 32 having a consumption current of a few hundred microamperes is used, the consumption current of the coulomb counter 34b, which is about 80 to 100 µA, accounts for a large proportion of the whole consumption current. To reduce the power consumption of the coulomb counter 34b, there is conceived a technique which causes the coulomb counter 34b to intermittently operate, and calculates the integrated current amount by using the average current obtained in the time periods in which the coulomb counter 34b operates. This technique, however, fails to obtain an accurate integrated current amount when the operation interval changes. For example, in the example of FIG. 10, the operation interval of the sensor device 32 in the time period Tn in which the coulomb counter 34b stops is shorter than the operation interval of the sensor device 32 in the time period Tm in which the coulomb counter 34b operates. In this case, because the average current in the time period Tn is larger than the average current in the time period Tm, a greater error occurs if the integrated current amount is calculated by using the average current obtained in the time period Tm.

In contrast, in the integrated-current-amount measurement apparatus 34, even when the operation interval of the sensor device 32 changes while the coulomb counter 34b stops, the change in the operation interval will affect the calculation result of the total integrated-current amount Ctotal, by capturing the number of operations of the sensor device 32. As a result, even when the coulomb counter 34b operates intermittently to reduce consumption current, the deterioration of calculation accuracy of the total integrated-current amount Ctotal is prevented.

Here, because the current-change detection circuit 34c and the counter 34e1 used to capture the number of operations of the sensor device 32 are achieved with circuits which consume far less power than the coulomb counter 34b, the power consumption of the integrated-current-amount measurement apparatus 34 is reduced.

In addition, because the total integrated-current amount Ctotal, calculated in such a manner, includes currents which flow in standby times of the sensor device 32, the deterioration of calculation accuracy caused in a case where a sensor device 32 having a longer standby time is used is also prevented.

The MCU 32a of the sensor device 32 may be designed to output a pulse signal which notifies the integrated-current-amount measurement apparatus 34 of the start of operation of the sensor device 32. In this case, the current-change detection circuit 34c may be eliminated. Instead of counting the number of pulses of the output signal Pout from the current-change detection circuit 34c, the counter 34e1 of the controller 34e may count the number of pulses of the pulse signal outputted by the MCU 32a of the sensor device 32.

In addition, the MCU 32a of the sensor device 32 may contain all or part of the integrated-current-amount measurement apparatus 34.

Fourth Embodiment

Figure 11:
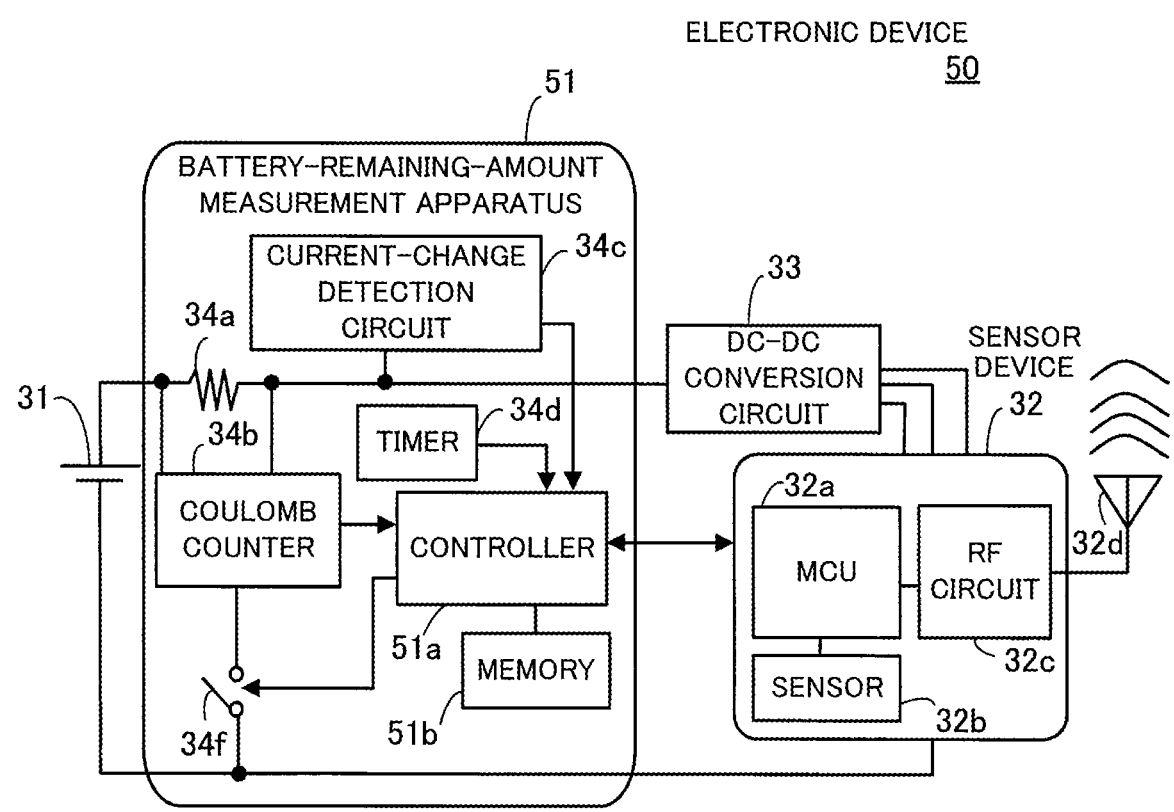
FIG. 11 illustrates one example of an electronic device and a battery-remaining-amount measurement apparatus of a fourth embodiment.

FIG. 11 illustrates one example of an electronic device and a battery-remaining-amount measurement apparatus of a fourth embodiment. In FIG. 11, identical components with those illustrated in FIG. 4 are designated with identical symbols.

A battery-remaining-amount measurement apparatus 51 of an electronic device 50 of the fourth embodiment has a controller 51a and a memory 51b different from those of the integrated-current-amount measurement apparatus 34 illustrated in FIG. 4.

Figure 12:
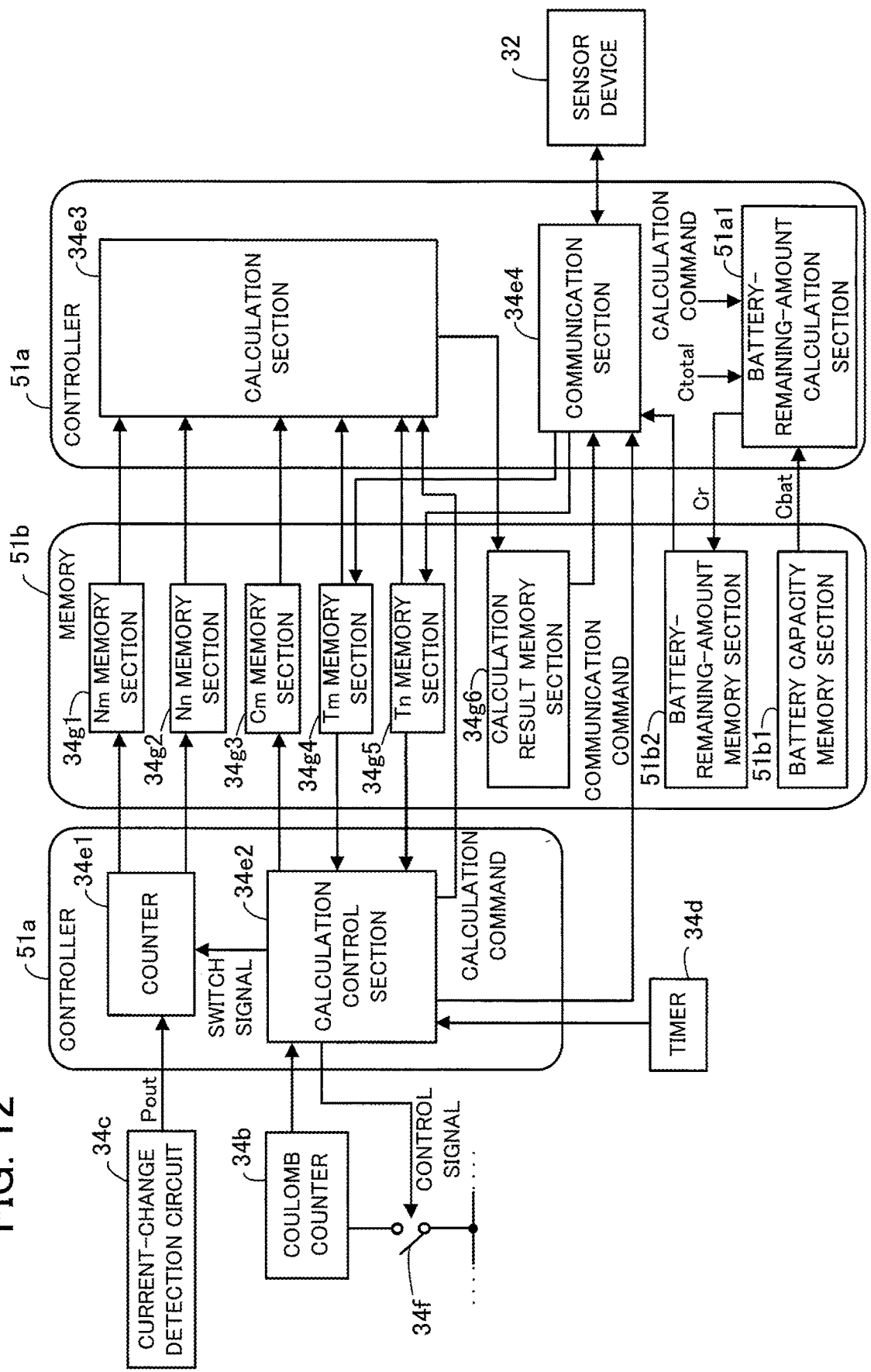
FIG. 12 illustrates one example of a controller and a memory of the battery-remaining-amount measurement apparatus.

FIG. 12 illustrates one example of the controller 51a and the memory 51b of the battery-remaining-amount measurement apparatus 51. In FIG. 12, identical components with those illustrated in FIG. 9 are designated with identical symbols.

The controller 51a of the battery-remaining-amount measurement apparatus 51 includes a battery-remaining-amount calculation section 51a1.

Upon receiving the calculation command from the calculation control section 34e2, the battery-remaining-amount calculation section 51a1 calculates the battery remaining amount Cr by using the total integrated-current amount Ctotal calculated by the calculation section 34e3, and the battery capacity Cbat stored in a battery capacity memory section 51b1 of the memory 51b. The battery remaining amount Cr, calculated in such a manner, is stored in a battery-remaining-amount memory section 51b2 of the memory 51b. As described above, the battery remaining amount Cr is expressed as Cr=Cbat−Ctotal.

A total integrated-current amount Ctotal calculated last time is updated by adding the total integrated-current amount Ctotal calculated this time to the total integrated-current amount Ctotal calculated last time.

The battery-remaining-amount calculation section 51a1 may update a battery remaining amount Cr calculated last time, by reading the battery remaining amount Cr calculated last time from the memory 51b, and by subtracting the total integrated-current amount Ctotal calculated this time from the battery remaining amount Cr calculated last time.

The battery-remaining-amount calculation section 51a1 may calculate the battery-remaining-amount ratio (Rr=Cr/Cbat) and the battery exhaustion time (Te=Cr/Iav).

The communication section 34e4 may read the battery-remaining-amount information stored in the memory 51b and send it to a server (not illustrated) via the sensor device 32, when receiving a request signal, which requests the battery-remaining-amount information including the battery remaining amount Cr, from the server via the sensor device 32.

The battery-remaining-amount measurement apparatus 51 of the fourth embodiment, configured in such a manner, accurately determines the battery remaining amount because of calculating the battery remaining amount by using the total integrated-current amount Ctotal calculated in the above-described manner. In addition, the battery-remaining-amount measurement apparatus 51 reduces power consumption in the same reason as that in the integrated-current-amount measurement apparatus 34 of the third embodiment.

The MCU 32a of the sensor device 32 may contain all or part of the battery-remaining-amount measurement apparatus 51.

Fifth Embodiment

Figure 13:
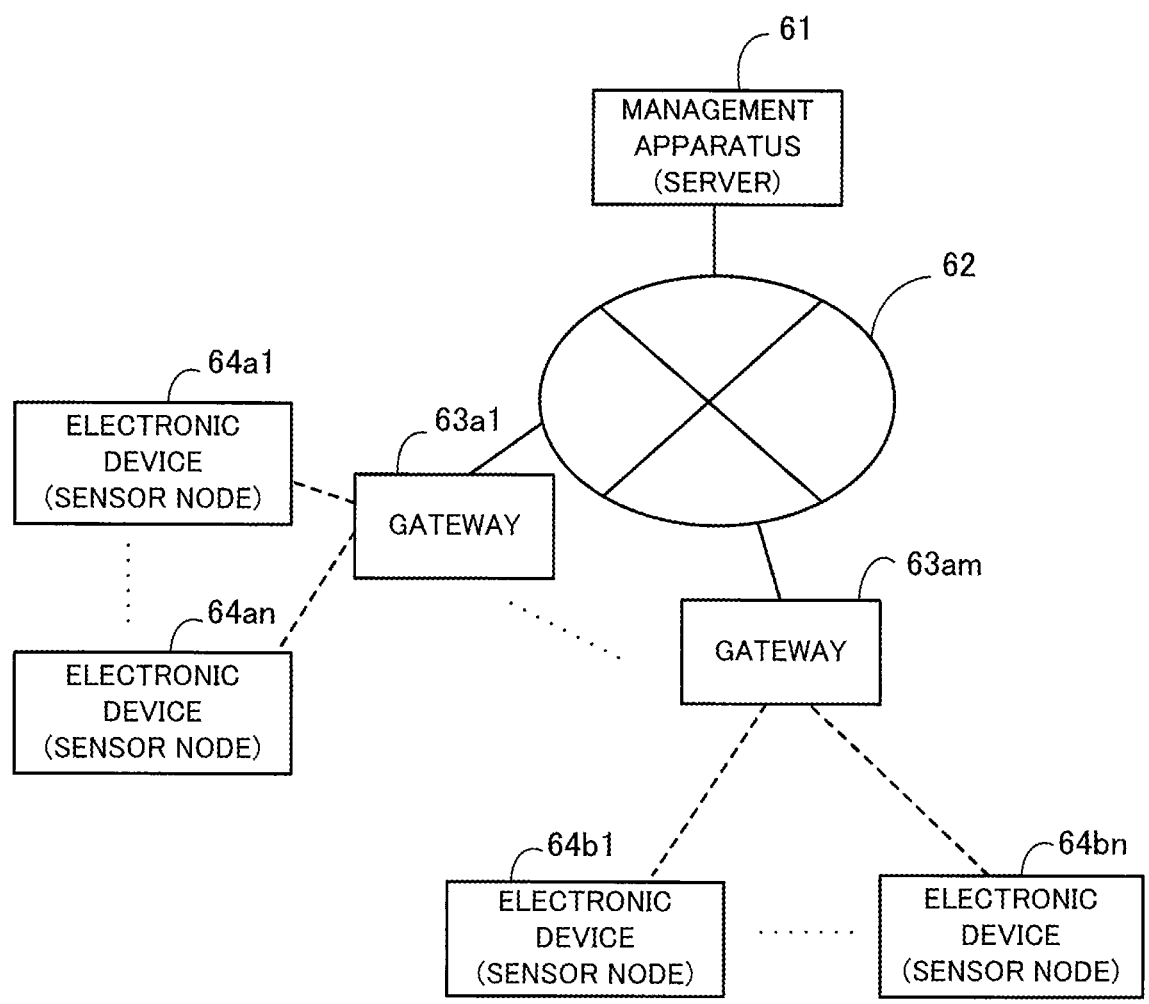
FIG. 13 illustrates one example of an electronic device control system of a fifth embodiment.

FIG. 13 illustrates one example of an electronic device control system of a fifth embodiment.

An electronic device control system 60 includes a management apparatus 61, a plurality of gateways 63a1 to 63am connected to the management apparatus 61 via a network 62, and a plurality of electronic devices which wirelessly communicate with the corresponding gateways 63a1 to 63am. For example, the gateway 63a1 wirelessly communicates with electronic devices 64a1 to 64an, and the gateway 63am wirelessly communicates with electronic devices 64b1 to 64bn.

For example, the plurality of electronic devices, such as the electronic devices 64a1 to 64an and 64b1 to 64bn, function as sensor nodes of a sensor network. Each of the plurality of electronic devices is the electronic device 10 in FIG. 1, 20 in FIG. 3, 30 in FIG. 4, or 50 in FIG. 11.

The management apparatus 61 functions as a server which controls the plurality of electronic devices.

Figure 14:
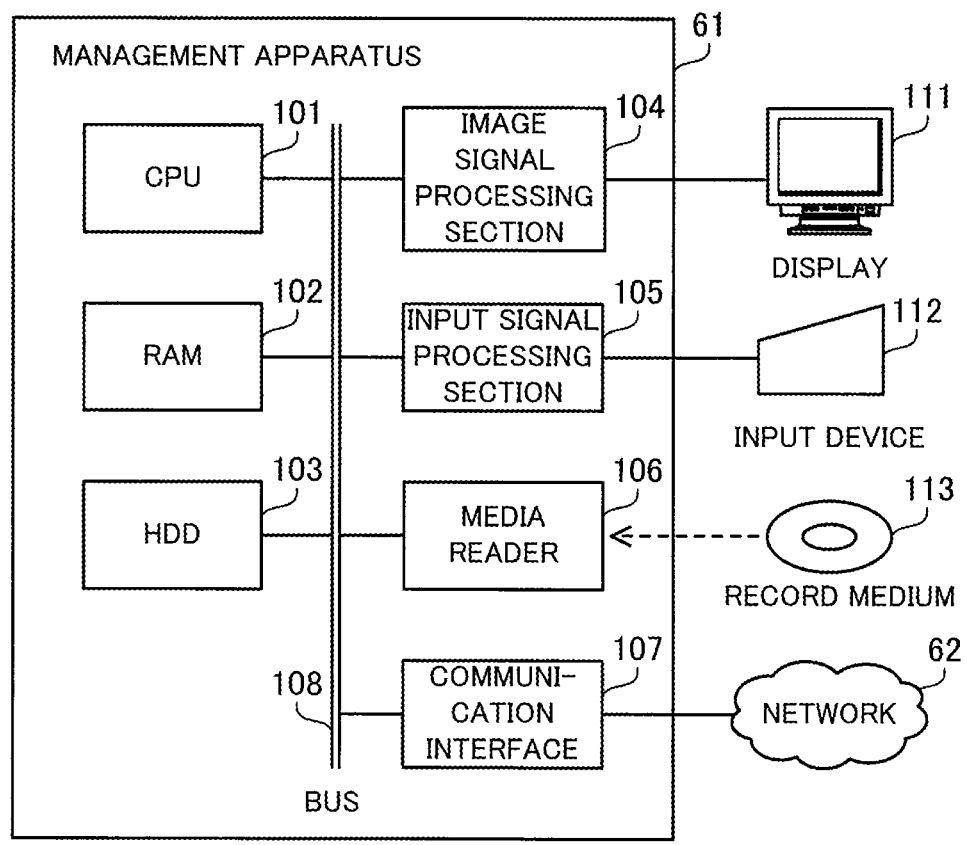
FIG. 14 illustrates an example of hardware of a management apparatus.

FIG. 14 illustrates an example of hardware of the management apparatus 61.

The management apparatus 61 includes a CPU 101, a RAM 102, a hard disk drive (HDD) 103, an image signal processing section 104, an input signal processing section 105, a media reader 106, and a communication interface 107. The CPU 101, the RAM 102, the HDD 103, the image signal processing section 104, the input signal processing section 105, the media reader 106, and the communication interface 107 are connected to a bus 108.

The CPU 101 is a processor containing an arithmetic logic circuit to execute instructions of programs. The CPU 101 loads at least one part of programs and data stored in the HDD 103 to the RAM 102; and executes a program. The CPU 101 may include a plurality of processor cores. The management apparatus 61 may include a plurality of processors, and execute the below-described processes in parallel by using the plurality of processors or processor cores. A group (multiprocessor) of a plurality of processors may be called a "processor."

The RAM 102 is a volatile semiconductor memory which temporarily stores programs executed by the CPU 101 and data used by the CPU 101 for computing. The management apparatus 61 may include another memory other than the RAM, and include a plurality of memories.

The HDD 103 is a nonvolatile storage which stores programs of software, such as operating system (OS), middleware, and application software, and data. The programs include, for example, a program which controls the electronic devices. The management apparatus 61 may include other types of storages, such as a flash memory and a solid state drive (SSD), and include a plurality of nonvolatile storages.

The image signal processing section 104 outputs an image to a display 111 connected to the management apparatus 61, depending on a command from the CPU 101. Examples of the display 111 include a cathode ray tube (CRT) display, a liquid crystal display (LCD), a plasma display panel (PDP), and an organic electro-luminescence (OEL) display.

The input signal processing section 105 receives an input signal from an input device 112 connected to the management apparatus 61, and outputs the input signal to the CPU 101. Examples of the input device 112 include a pointing device, such as a mouse, a touch panel, or a track ball, a keyboard, a remote controller, and a button switch. In addition, two or more types of input devices may be connected to the management apparatus 61.

The media reader 106 is a reading device to read programs and data stored in a record medium 113. Examples of the record medium 113 include a magnetic disk, an optical disk, a magneto-optical disk (MO), and a semiconductor memory. Examples of the magnetic disk include a flexible disk (FD) and an HDD. Examples of the optical disk include a compact disc (CD) and a digital versatile disc (DVD).

For example, the media reader 106 reads a program and data from the record medium 113, and copies them to another record medium, such as the RAM 102 or the HDD 103. The program which has been read is, for example, executed by the CPU 101. The record medium 113 may be a portable record medium, which may be used to distribute programs and data. The record medium 113 and the HDD 103 may be referred to as computer-readable record media.

The communication interface 107 is an interface which is connected to the network 62 and wirelessly communicates with the sensor nodes via the network 62 and the gateways 63a1 to 63am illustrated in FIG. 13. The communication interface 107 may be a wire communication interface connected with a communication device, such as a switch, via a cable, or may be a wireless communication interface connected with a base station via a radio link.

Hereinafter, one example of an operation of the management apparatus 61 will be described. In the following description, the plurality of electronic devices are referred to as sensor nodes.

Figure 15:
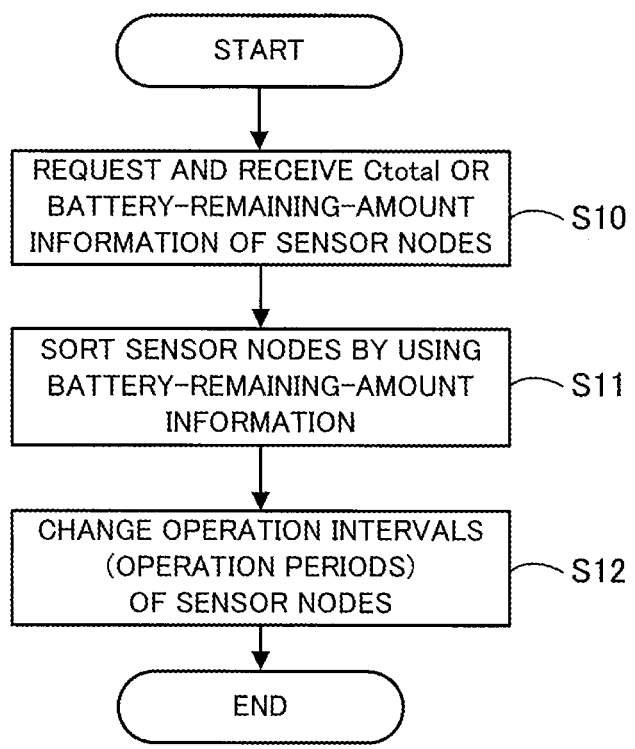
FIG. 15 is a flowchart illustrating one example of an operation of the management apparatus.

FIG. 15 is a flowchart illustrating one example of an operation of the management apparatus 61.

Step S10: The management apparatus 61 sends a request signal, which requests the above-described total integrated-current amount Ctotal or the battery-remaining-amount information, to each of the sensor nodes. The battery-remaining-amount information may be the above-described battery remaining amount Cr, the battery-remaining-amount ratio Rr, or the battery exhaustion time Te. Upon receiving the request signal via the network 62 and the gateways 63a1 to 63am, each of the sensor nodes sends the total integrated-current amount Ctotal or the battery-remaining-amount information stored in the memory (e.g. the memory 34g in FIG. 4 or the memory 51b in FIG. 11). The management apparatus 61 then receives the total integrated-current amount Ctotal or the battery-remaining-amount information via the network 62 and the gateways 63a1 to 63am.

Step S11: The management apparatus 61 sorts the sensor nodes by using the battery-remaining-amount information. In a case where the management apparatus 61 receives the total integrated-current amount Ctotal from a certain sensor node, the management apparatus 61 calculates the battery remaining amount by using the battery capacity Cbat of the certain sensor node. Thus, in the case where a sensor node does not have a function to calculate the battery remaining amount, the management apparatus 61 has the function to calculate the battery remaining amount and a memory to store the battery capacity Cbat of the sensor node (and the time periods Tm and Tn if the battery exhaustion time Te is used).

Hereinafter, an example of a sort performed by using the battery-remaining-amount ratio Rr, which is one of the battery-remaining-amount information, will be described.

FIG. 16 illustrates one example of the sort.

In FIG. 16, eight sensor nodes are sorted in ascending order of the battery-remaining-amount ratio Rr, for example. In the example of FIG. 16, a sensor node N2 is sorted to be the top, because of having the smallest battery-remaining-amount ratio Rr of 48% in the eight sensor nodes. In contrast, a sensor node N1 is sorted to be the bottom, because of having the largest battery-remaining-amount ratio Rr of 72% in the eight sensor nodes.

Step S12: The management apparatus 61 changes operation intervals (operation periods) of the sensor nodes, based on a sort result. For example, the management apparatus 61 sets operation periods of the sensor nodes, based on the sort result illustrated in FIG. 16. Here, each of the operation periods of the sensor nodes is, for example, an operation period of the sensor device 32 illustrated in FIG. 4.

Figure 17:
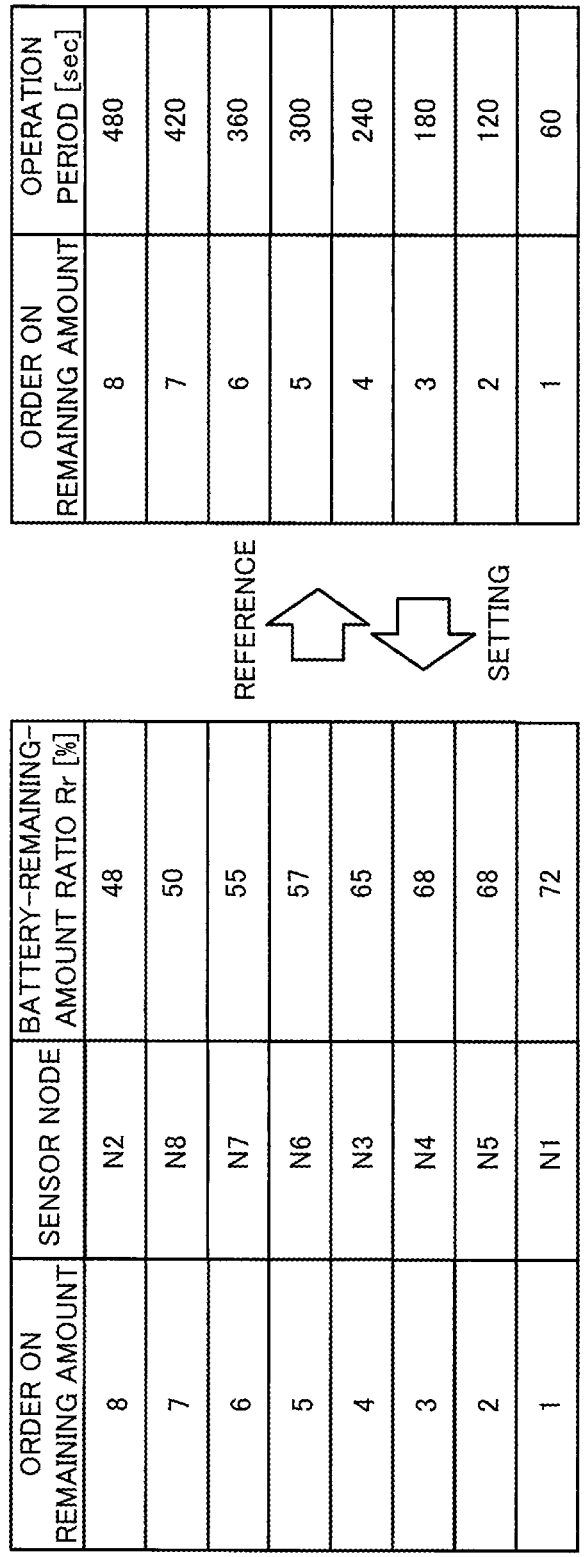
FIG. 17 illustrates an example of a setting of operation periods of sensor nodes.

FIG. 17 illustrates an example of setting of operation periods of the sensor nodes.

The management apparatus 61 refers to the sort result and sets the operation periods such that the lower order a sensor node has on the battery remaining amount (that is, the smaller ratio a sensor node has on the battery-remaining-amount ratio Rr), the longer operation period (interval) the sensor node has. In the example of FIG. 17, the sensor node N2, which has the lowest battery-remaining-amount ratio Rr, has a setting of the longest operation period, 480 seconds, in the eight sensor nodes. In contrast, the sensor node N1, which has the highest battery-remaining-amount ratio Rr, has a setting of the shortest operation period, 60 seconds, in the eight sensor nodes.

The operation periods which are set in the example of FIG. 17 are fixed values, but the operation periods may be values determined by a function of the battery-remaining-amount ratio Rr.

The management apparatus 61 sends instruction signals which instruct the sensor nodes to change their operation periods as described above. The sensor nodes receive the instruction signals via the network 62 and the gateways 63a1 to 63am and operate with the operation periods determined by the instruction signals.

Figure 18:
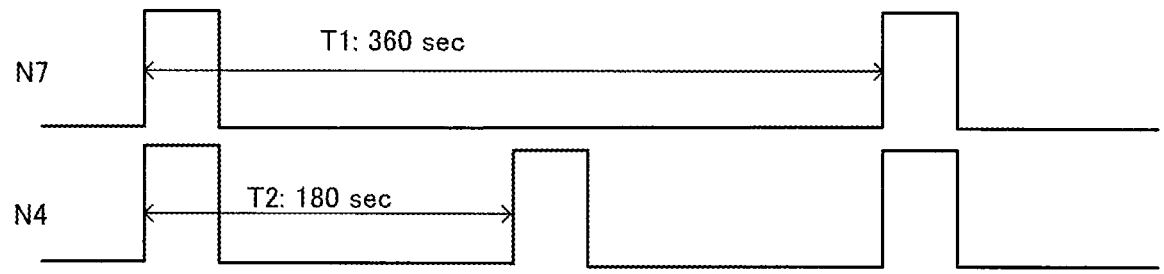
FIG. 18 illustrates one example of waveforms of load currents of the sensor nodes in which the operation periods are set.

FIG. 18 illustrates one example of waveforms of load currents of the sensor nodes in which the operation periods are set.

In FIG. 18, waveforms of load currents of sensor nodes N7 and N4 are illustrated as an example. A timing at which a load current increases corresponds to a timing at which a load (e.g. the sensor device 32 of FIG. 4) starts to operate. As illustrated in FIG. 18, the sensor node N7 with the sixth place on the battery remaining amount has an operation period T1 of 360 seconds, and the sensor node N4 with the third place on the battery remaining amount has an operation period T2 of 180 seconds.

With these operations, one cycle of control performed by the management apparatus 61 to each of the sensor nodes is complete. For example, the management apparatus 61 may repeat the above-described control at predetermined intervals. For example, the management apparatus 61 may perform the above-described process at a predetermined time every day.

In the above-described example, the management apparatus 61 sends the request signal, which requests the total integrated-current amount Ctotal or the battery-remaining-amount information, to each of the sensor nodes. But, each of the sensor nodes may periodically send the total integrated-current amount Ctotal or the battery-remaining-amount information to the management apparatus 61.

The electronic device control system as described above controls each of the sensor nodes so that the sensor nodes have the same battery exhaustion time.

For example, the sensor nodes may be installed at many locations in an infrastructure, which may be a sewage-overflow detection system. Each of the sensor nodes operates with a dry battery which will be replaced manually by a worker. Thus, if batteries of the sensor nodes were replaced by a worker on different days, the operational cost would increase. In contrast, the above-described electronic device control system, which obtains the battery-remaining-amount information of each of the sensor nodes, controls each of the sensor nodes so that the batteries of the sensor nodes are replaced on the same day. With this control, the operational cost is reduced.

The control performed by the above-described electronic device control system to the electronic devices is achieved by causing the management apparatus 61 to execute a program. The program is stored in a computer-readable record medium (for example, the record medium 113). Examples of the record medium include a magnetic disk, an optical disk, a magneto-optical disk, and a semiconductor memory. Examples of the magnetic disk include an FD and an HDD. Examples of the optical disks include a CD, a CD-R/RW (Recordable/Rewritable), a DVD, and a DVD-R/RW. The program may be recorded in a portable record medium and distributed. In this case, the program may be copied from the portable record medium to another record medium (such as the HDD 103), and executed by using the other record medium.

In the above description, the integrated-current-amount measurement apparatus, the battery-remaining-amount measurement apparatus, the electronic device control system, and the method of measuring the integrated-current amount of the present disclosure have been described, as one aspect, based on the embodiments. However, these are merely one example, and do not limit the present disclosure.

In one aspect, the deterioration of calculation accuracy of the integrated current amount is prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An integrated-current-amount measurement apparatus comprising:
    a measurement circuit configured to measure a first integrated amount of a current which flows from a battery to a load, the first integrated amount being an amount in a first time period in which the measurement circuit operates;
    a detection circuit configured to detect an operation of the load and to increase a count value every time the operation is detected, the detection circuit including an operation detection circuit configured to detect the operation by detecting an increase of the current or receiving a signal indicating an occurrence of the operation, and a counter configured to increase the count value every time the increase of the current is detected or the signal is received; and
    a calculation circuit configured to calculate a second integrated amount of the current on a basis of the count value and the first integrated amount, the second integrated amount being an amount in a third time period including a second time period in which the measurement circuit stops.

2. The integrated-current-amount measurement apparatus according to claim 1, wherein the calculation circuit is configured to calculate the second integrated amount on a basis of a first value which is the count value in the first time period, a second value which is the count value in the second time period, and the first integrated amount.

3. The integrated-current-amount measurement apparatus according to claim 1, wherein the load is a sensor device which acquires environmental data at first operation intervals or at second operation intervals shorter than the first operation intervals.

4. A battery-remaining-amount measurement apparatus comprising:
    a measurement circuit configured to measure a first integrated amount of a current which flows from a battery to a load, the first integrated amount being an amount in a first time period in which the measurement circuit operates;
    a detection circuit configured to detect an operation of the load and to increase a count value every time the operation is detected, the detection circuit including an operation detection circuit configured to detect the operation by detecting an increase of the current or receiving a signal indicating an occurrence of the operation, and a counter configured to increase the count value every time the increase of the current is detected or the signal is received;
    a first calculation circuit configured to calculate a second integrated amount of the current on a basis of the count value and the first integrated amount, the second integrated amount being an amount in a third time period including a second time period in which the measurement circuit stops; and
    a second calculation circuit configured to calculate battery-remaining-amount information indicating a remaining amount of the battery on a basis of the second integrated amount and a battery capacity of the battery.

5. An electronic device control system comprising:
    a plurality of electronic devices each including:
        a load having a communication function,
        a measurement circuit configured to measure a first integrated amount of a current which flows from a battery to the load, the first integrated amount being an amount in a first time period in which the measurement circuit operates,
        a detection circuit configured to detect a number of operations of the load, and
        a first calculation circuit configured to calculate a second integrated amount of the current on a basis of the number of operations and the first integrated amount, the second integrated amount being an amount in a third time period including a second time period in which the measurement circuit stops, the plurality of electronic devices each causing the load to send battery-remaining-amount information or the second integrated amount, the battery-remaining-amount information being calculated on a basis of the second integrated amount and a battery capacity of the battery and indicating a remaining amount of the battery; and
    a management apparatus configured to receive the battery-remaining-amount information or the second integrated amount sent from the load of each of the plurality of electronic devices, and send instruction signals to the plurality of electronic devices, the instruction signals each instructing one of the plurality of electronic devices, on a basis of the battery-remaining-amount information or the second integrated amount, to change an operation interval of the load.

6. The electronic device control system according to claim 5, wherein
    the management apparatus is configured to send the instruction signals on a basis of the battery-remaining-amount information or the second integrated amount, and
    the instruction signals are sent such that a first electronic device of the plurality of electronic devices makes the operation interval of the load longer when the first electronic device has the battery having less of the remaining amount.

* * * * *